United States Patent
Chen

(10) Patent No.: US 8,995,571 B2
(45) Date of Patent: Mar. 31, 2015

(54) BASEBAND DIGITAL PRE-DISTORTION ARCHITECTURE

(71) Applicant: Dong Chen, Beijing (CN)

(72) Inventor: Dong Chen, Beijing (CN)

(73) Assignee: Analog Devices Global, Hamilton (BM)

( * ) Notice: Subject to any disclaimer, the term of this patent is extended or adjusted under 35 U.S.C. 154(b) by 79 days.

(21) Appl. No.: 13/803,797

(22) Filed: Mar. 14, 2013

(65) Prior Publication Data

US 2014/0269990 A1    Sep. 18, 2014

(51) Int. Cl.
*H04L 27/36* (2006.01)
*H03F 1/32* (2006.01)

(52) U.S. Cl.
CPC ............ *H04L 27/367* (2013.01); *H03F 1/3247* (2013.01)
USPC ........................................................ 375/297

(58) Field of Classification Search
CPC ... H03F 1/3247; H03F 1/3258; H03F 1/3294; H04B 1/0475; H04L 25/03038; H04L 25/03343
USPC .......................................................... 375/297
See application file for complete search history.

(56) References Cited

U.S. PATENT DOCUMENTS

| | | | |
|---|---|---|---|
| 8,213,884 B2 | 7/2012 | Kim et al. | |
| 8,351,877 B2 * | 1/2013 | Kim et al. | 455/114.3 |
| 8,498,591 B1 * | 7/2013 | Qian et al. | 455/114.3 |
| 8,699,620 B1 * | 4/2014 | Wu | 375/297 |
| 2005/0195919 A1 * | 9/2005 | Cova | 375/297 |
| 2007/0237260 A1 * | 10/2007 | Hori et al. | 375/296 |
| 2009/0146736 A1 * | 6/2009 | Kim et al. | 330/149 |
| 2010/0277236 A1 * | 11/2010 | Horiguchi et al. | 330/149 |
| 2011/0298536 A1 * | 12/2011 | Okazaki et al. | 330/107 |
| 2013/0243124 A1 * | 9/2013 | Yang et al. | 375/297 |

OTHER PUBLICATIONS

Kai Fu et al.; "A new power amplifier predistortion architecture based on memory polynomial model," Information, Communications and Signal Processing, 2009. ICICS 2009. 7th International Conference on, vol., no., pp. 1, 5, 8-10, Dec. 2009.*

Mao-Ching Chiu et al.; "Predistorter Based on Frequency Domain Estimation for Compensation of Nonlinear Distortion in OFDM Systems," Vehicular Technology, IEEE Transactions on , vol. 57, No. 2, pp. 882,892, Mar. 2008.*

* cited by examiner

*Primary Examiner* — Daniel Washburn
*Assistant Examiner* — Berhanu Tadese
(74) *Attorney, Agent, or Firm* — Kenyon & Kenyon, LLP

(57) ABSTRACT

An amplifier may include a predistorter receiving an input signal to generate a predistortion signal, a first converter receiving the predistortion signal to generate a preamplified signal, a power amplifier receiving the preamplified signal to generate an output signal based on the preamplified signal and the input signal, and a second converter sampling the output signal to generate a feedback signal. The predistorter may separately and independently generate a predistortion signal component for the in-phase input signal and a predistortion signal component for the quadrature input signal.

20 Claims, 3 Drawing Sheets

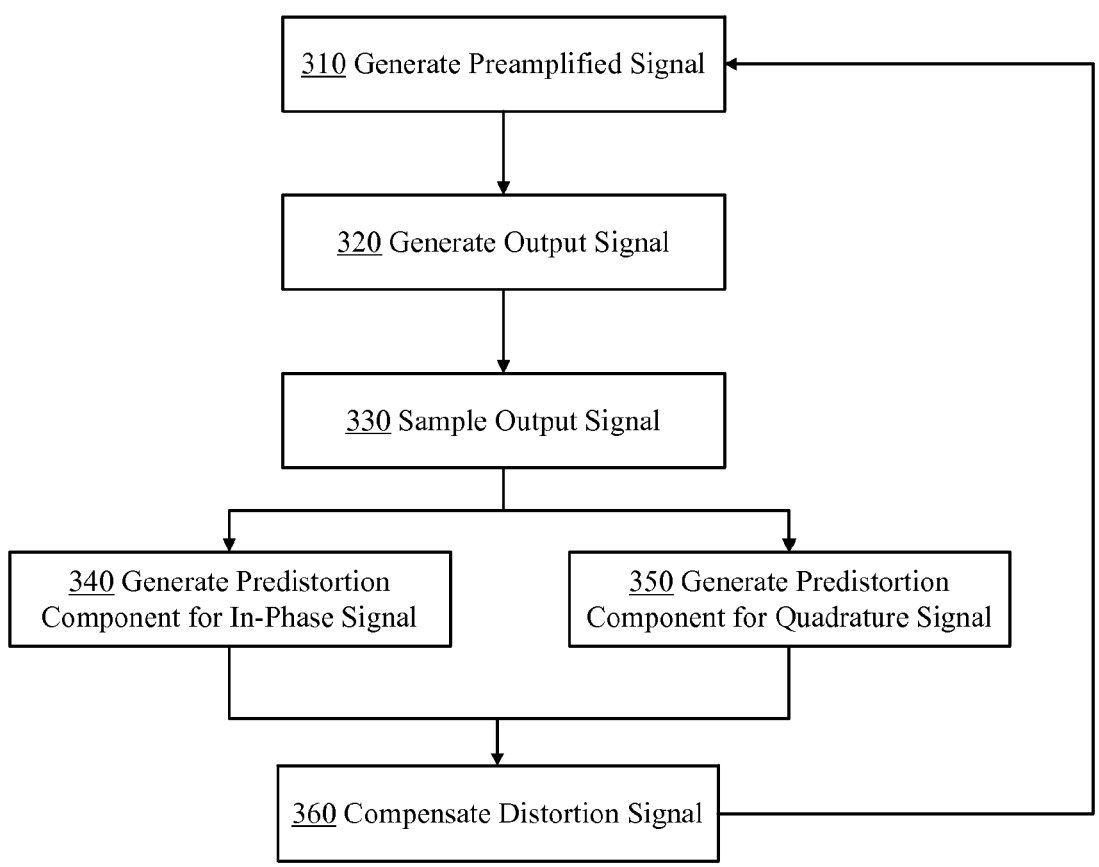

BASEBAND DIGITAL PRE-DISTORTION ARCHITECTURE

BACKGROUND

Power amplifiers (PA) may be used in various applications, such as in broadcast equipment for wireless communication. The broadcast equipment may be contained in base transceiver station (BTS) or user equipment (UE) or other transceiver equipment used for wireless mobile communications, such as in LTE, WiMax, WiFi, CDMA, GSM, EDGE, and UMTS standards.

Power amplifiers for power amplifying input signals may ideally produce output signals that are linear amplification of the input signals. However, power amplifiers in applications would have distortions due to nonlinear properties, or nonlinearities in the power amplifiers. In order to reduce such distortions in the output signals, the nonlinearities in the power amplifiers may need to be compensated.

For example, a typical power amplifier in a BTS may represent a significant portion of the cost and power demand of the BTS, for example, 30% of total power demand and 30% of the cost. A typical power amplifier may have one or more zone of nonlinearity, and the nonlinear behavior of the typical power amplifier may be affected by various factors such as power supply, temperature, gain setting, etc. Nonlinearity in the power amplifier may degrade error vector magnitude (EVM), which is used to quantify the performance of a radio transmitter or receiver, and increase spectral regrowth, which is the spreading of signal bandwidth due to distortions. Typically, only nonlinearities in the backend components near the output, i.e. radio frequency (RF) distortions, are considered for compensation. However, nonlinearities may also occur near the frontend, i.e. baseband nonlinear distortions. In the frontend circuit paths, the nonlinearity in the in-phase signal path may be different from the nonlinearity in the quadrature-phase signal path.

Thus, there is a need for improved power amplifiers that compensates for baseband nonlinearity.

BRIEF DESCRIPTION OF THE DRAWINGS

FIG. 3 illustrates an exemplary method according to an embodiment of the present disclosure.

DETAILED DESCRIPTION

According to an exemplary embodiment of the present disclosure, an amplifier may include a predistorter receiving an input signal to generate a predistortion signal, a first converter receiving the predistortion signal to generate a preamplified signal, a power amplifier receiving the preamplified signal to generate an output signal based on the preamplified signal and the input signal, and a second converter sampling the output signal to generate a feedback signal. The predistorter may separately and independently generate a predistortion signal component for the in-phase input signal and a predistortion signal component for the quadrature input signal.

Thus, the input signal may be separated into in-phase and quadrature-phase portions, algorithms may be used to compute two separate and independent sets of complex number coefficients, and the coefficients may be applied separately and independently to in-phase signal path and quadrature signal path of the input signal near the frontend. The two sets of coefficient for the I and Q paths may be different, and thus may achieve in better performance when correcting for baseband type non-linearities by compensating for the I and Q paths independently.

Figure 1:
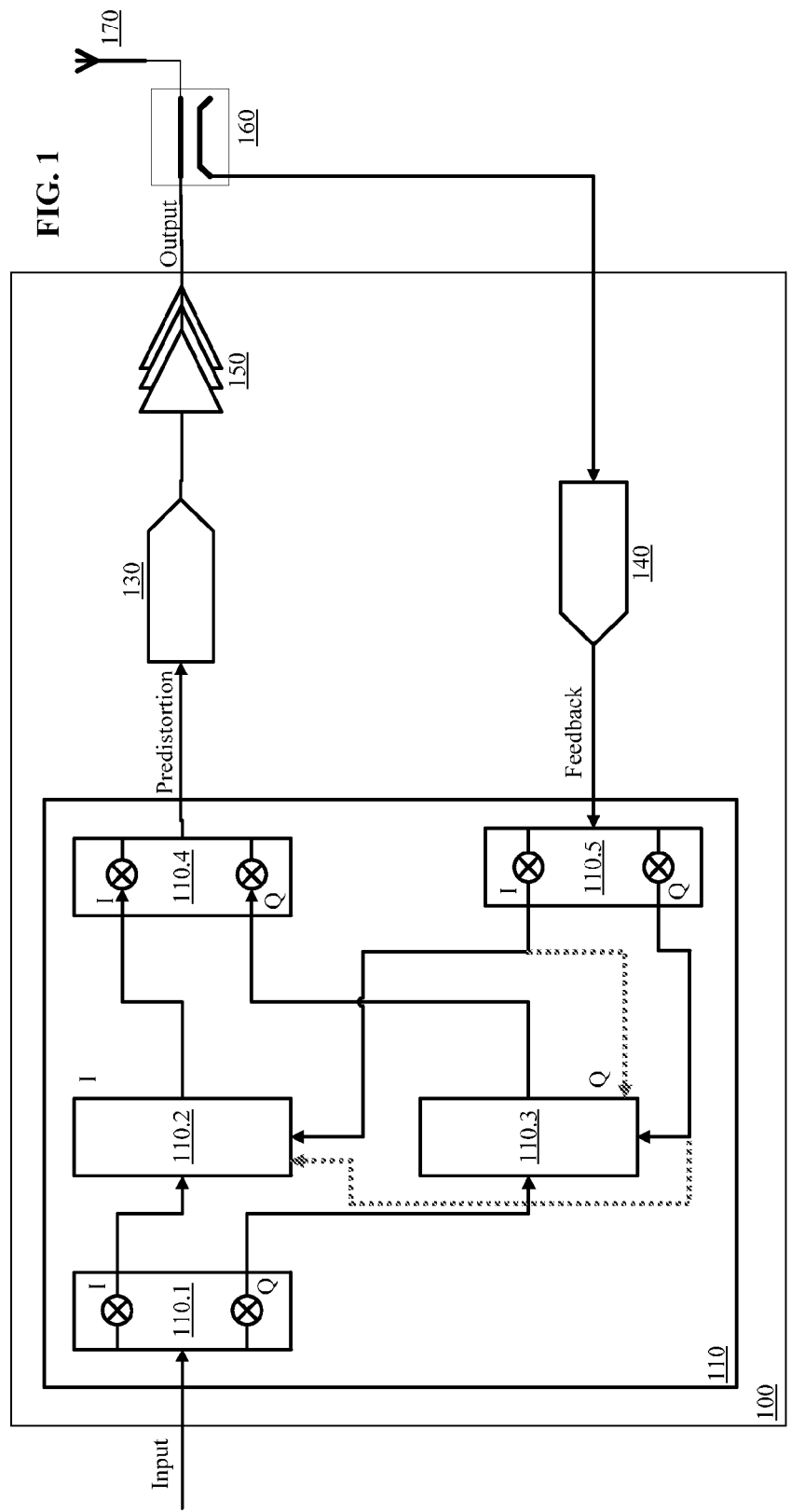
FIG. 1 illustrates a simplified block diagram of a amplifier according to an embodiment of the present disclosure.

FIG. 1 illustrates a simplified block diagram of an amplifier 100 according to an embodiment of the present disclosure. The amplifier 100 may include a predistorter 110 receiving an input signal to generate a predistortion signal, a first converter 130 receiving the predistortion signal to generate a preamplified signal, a power amplifier 150 receiving the preamplified signal to generate an output signal based on the preamplified signal and the input signal, and a second converter 140 sampling the output signal to generate a feedback signal.

The predistorter 110 may separately or independently generate a predistortion signal component for the in-phase input signal and a predistortion signal component for the quadrature input signal.

The output signal may be transmitted via an antenna 170. The second converter 140 may receive the output signal via a coupling 160. Between the first converter 130 and the power amplifier 150, there may be additional components, for example, modulators to convert the signal from Baseband/intermediate frequency (IF) to radio frequency (RF) in the transmission path. Between the second converter 140 and the coupling 160, there may be additional components, for example, modulators to convert the signal from RF to IF/Baseband in the receiving/feedback path. The additional components may include super-heterodyne or zero-IF transceivers.

According to the embodiment of the present disclosure, the predistorter 110 may include a first filter 110.2 and a second filter 110.3, and each filter may separately or independently transform a component of the input signal to generate a component of the predistortion signal. The first filter 110.2 may receive the in-phase component of the input signal, and may generate a first component of the predistortion signal. The second filter 110.3 may receive the quadrature component of the input signal, and may generate a second component of the predistortion signal. The first and second component of the predistortion signal each may be a complex signal.

The first and second filters 110.2 and 110.3 may include storages with lookup tables (LUT). The first and second filters 110.2 and 110.3 may include polynomial based filters, which may distort an input signal based on a polynomial equation of multiple orders that includes compensation for nonlinear distortions. A polynomial based filter may be capable of effectively compensating for the memory effects of a PA without significant additional modifications. A polynomial based filter for a predistorter used in communication applications may achieve sufficient compensation with a fifth order polynomial equation. However, other number of orders is possible.

The predistorter 110 may include a first demodulator 110.1 and a second demodulator 110.5. The first demodulator 110.1 may demodulate and split the input signal into its in-phase component and its quadrature component. The first demodulator 110.1 may send the in-phase component of the input signal to the first filter 110.2 for pre-distortion processing. The first demodulator 110.1 may send the quadrature component of the input signal to the second filter 110.3 for pre-distortion processing. The second demodulator 110.5 may demodulate and split the feedback signal into its in-phase component and its quadrature component. The second demodulator 110.5 may send the in-phase component of the feedback signal to the first filter 110.2 for pre-distortion processing, and may send the quadrature component of the feedback signal to the second filter 110.3 for pre-distortion processing. Alternatively, the second demodulator 110.5 may send any or all components of the feedback signal to the first filter 110.2 for pre-distortion processing, and may send any or all components of the feedback signal to the second filter 110.3 for pre-distortion processing.

Alternatively, the second demodulator 110.5 may be in the analog domain and placed in the feedback path before the second converter 140. For example, the feedback path may be a zero-intermediate frequency (IF) receiver configuration, which may include two analog-to-digital converters (ADC) to sample a demodulated output received from an analog quadrature demodulator.

The predistorter 110 may include a modulator 110.4 which may receive the first component and the second component of the predistortion signal, combine them to generate the predistortion signal.

The first filter 110.2 and the second filter 110.3 may be each adjusted and controlled to transform the input signal to generate the first component and the second component of the predistortion signal to compensate for nonlinearities, for example, baseband nonlinearities, RF nonlinearities, etc., in the power amplifier 100.

The first filter 110.2 and the second filter 110.3 may include adaptive filter algorithms to adjust settings or parameters of the first filter 110.2 and the second filter 110.3. Adaptive filter algorithms may include least mean square (LMS), least square (LS), recursive least square (RLS), linear quadratic estimation (LQE, Kalman Filter), or Bayesian estimation algorithm.

Additionally, the first filter 110.2 and the second filter 110.3 may include learning algorithm that continually log and monitor the feedback signal or the error signal (as well as other information, such as performance level of the PA and environmental conditions), to continually calibrate and improve the performance of the amplifier 100. The first filter 110.2 and the second filter 110.3 may include time-delay algorithm to compensate for the time delay of the feedback signal relative to the input signal.

The first filter 110.2 and the second filter 110.3 each may perform a signal transform modeled according to a polynomial equation for nonlinearity, such as a truncated discrete time Volterra Series equation.

Figure 2:
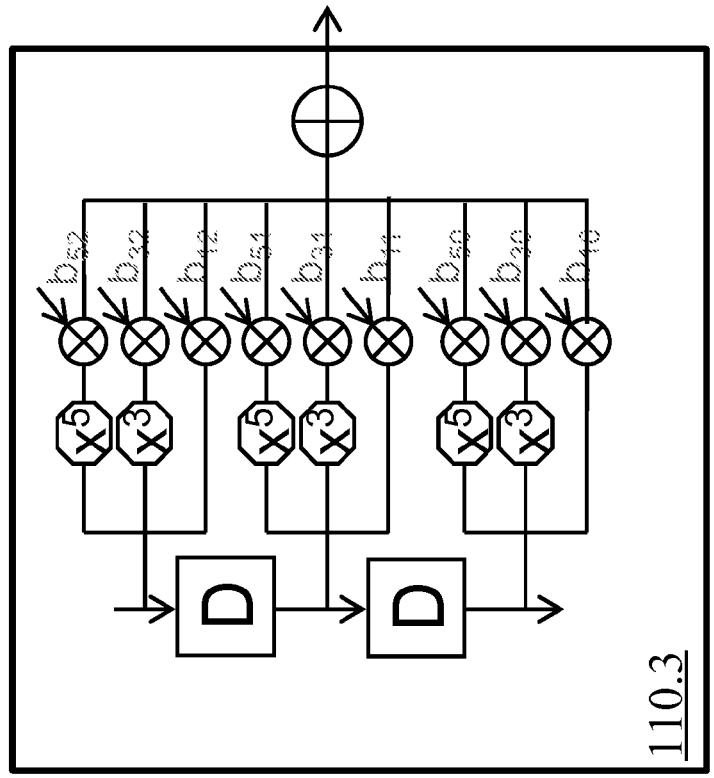
FIG. 2 illustrates exemplary filters in an exemplary predistorter according to an embodiment of the present disclosure.
Figure 2:
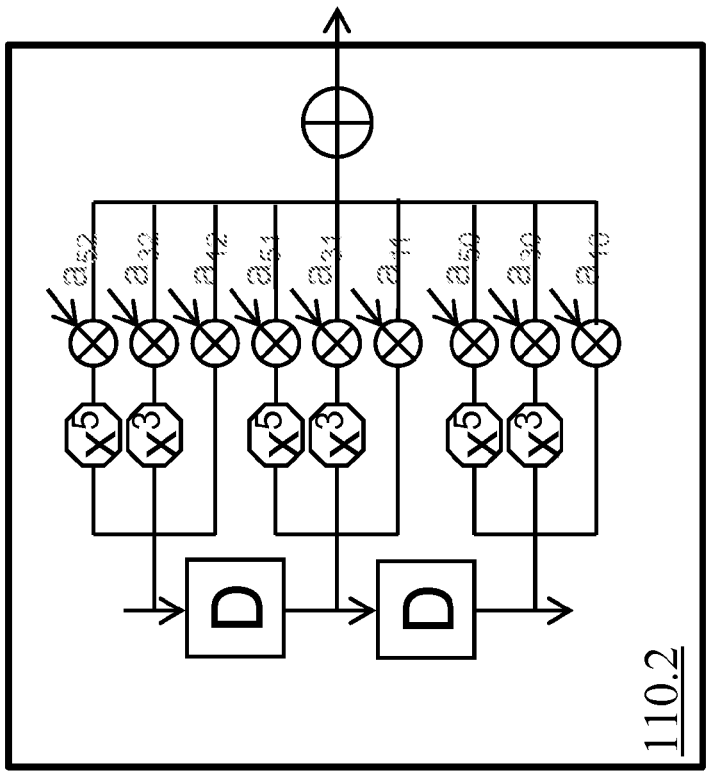

FIG. 2 illustrates exemplary filters 110.2 and 110.3 in an exemplary predistorter according to an embodiment of the present disclosure. As shown in FIG. 2, the first filter 110.2 and the second filter 110.3 each may include a polynomial architecture for generating the first and the second components of the predistortion signal, modeled according a truncated discrete time Volterra Series equation of the fifth order. The first filter 110.2 and the second filter 110.3 each may include their own separate and independent set of coefficients for their respective models of nonlinearities. The first filter 110.2 may include coefficients $a_{10}$, $a_{30}$, $a_{50}$, $a_{11}$, $a_{31}$, $a_{51}$, $a_{12}$, $a_{32}$, and $a_{52}$, and the second filter 110.3 may include coefficients $b_{10}$, $b_{30}$, $b_{50}$, $b_{11}$, $b_{31}$, $b_{51}$, $b_{12}$, $b_{32}$, and $b_{52}$. The coefficients $a_{10}$, $a_{30}$, $a_{50}$, $a_{11}$, $a_{31}$, $a_{51}$, $a_{12}$, $a_{32}$, and $a_{52}$, and $b_{10}$, $b_{30}$, $b_{50}$, $b_{11}$, $b_{31}$, $b_{51}$, $b_{12}$, $b_{32}$, and $b_{52}$, etc., may be each a complex number. (For example: $a_{10}=a_{i10}+i*a_{q10}$)

As the first filter 110.2 and the second filter 110.3 each may include their own separate and independent set of coefficients for their respective models of nonlinearities, the nonlinearities in the in-phase signal path may be modeled separately from the nonlinearities in the quadrature signal path for the PA. Thus, the additional coefficients and independent nonlinearity modeling may improve compensation for the nonlinearities near the frontend of the PA, i.e. the baseband nonlinearities.

Alternatively, the first filter 110.2 and the second filter 110.3 may be controlled by a controller (not shown) in the PA.

According to a feature of the present disclosure, the first converter 130 may include a digital-to-analog converter, or a plurality of digital-to-analog converters with a plurality of signal channels. The second converter 140 may include an analog-to-digital converter, or a plurality of analog-to-digital converters with a plurality of signal channels.

FIG. 3 illustrates an exemplary method 300 for compensating distortions in PA. The method may include generating, by a first converter 130, a preamplified signal based on a predistortion signal at block 310. At block 320, a power amplifier 150 may generate an output signal based on the preamplified signal and the input signal. At block 330, a second converter 140 may sample the output signal to generate a feedback signal. At block 340, a predistorter 110 may generate a first component of the predistortion signal based on an in-phase component of the input signal. At block 350, a predistorter 110 may generate a second component of the predistortion signal based on a quadrature component of the input signal. At block 360, a predistorter 110 may combine the first component and the second component of the predistortion signal to compensate for nonlinearity in the PA based on the input signal.

It is appreciated that the disclosure is not limited to the described embodiments, and that any number of scenarios and embodiments in which conflicting appointments exist may be resolved.

Although the disclosure has been described with reference to several exemplary embodiments, it is understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular means, materials and embodiments, the disclosure is not intended to be limited to the particulars disclosed; rather the disclosure extends to all functionally equivalent structures, methods, and uses such as are within the scope of the appended claims.

While the computer-readable medium may be described as a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the embodiments disclosed herein.

The computer-readable medium may comprise a non-transitory computer-readable medium or media and/or comprise a transitory computer-readable medium or media. In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to capture carrier wave signals such as a signal communicated over a transmission medium. Accordingly, the disclosure is considered to include any computer-readable medium or other equivalents and successor media, in which data or instructions may be stored.

Although the present application describes specific embodiments which may be implemented as code segments in computer-readable media, it is to be understood that dedicated hardware implementations, such as application specific integrated circuits, programmable logic arrays and other hardware devices, can be constructed to implement one or more of the embodiments described herein. Applications that may include the various embodiments set forth herein may broadly include a variety of electronic and computer systems. Accordingly, the present application may encompass software, firmware, and hardware implementations, or combinations thereof.

The present specification describes components and functions that may be implemented in particular embodiments with reference to particular standards and protocols, the disclosure is not limited to such standards and protocols. Such standards are periodically superseded by faster or more efficient equivalents having essentially the same functions. Accordingly, replacement standards and protocols having the same or similar functions are considered equivalents thereof.

The illustrations of the embodiments described herein are intended to provide a general understanding of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "disclosure" merely for convenience and without intending to voluntarily limit the scope of this application to any particular disclosure or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

I claim:

1. An amplifier, comprising:
   a predistorter receiving an input signal;
   a first converter receiving an output of the predistorter to generate a preamplified signal;
   a power amplifier receiving the preamplified signal to generate an output signal based on the preamplified signal; and
   a second converter sampling the output signal to generate a feedback signal;
   wherein the predistorter, based upon an in-phase component of the input signal and the feedback signal, introduces a first component of the predistortion signal corresponding to the in-phase component of the input signal, and the predistorter, based upon a quadrature component of the input signal and the feedback signal, introduces a second component of the predistortion signal corresponding to the quadrature component of the input signal;
   wherein the predistorter compensates for nonlinearities in the in-phase component and the quadrature component by separately and independently applying a first set of coefficients to the in-phase component and a second set of coefficients to the quadrature-phase component, the first and second sets of coefficients being different from each other.

2. The amplifier according to claim 1, wherein the first converter comprises a digital-to-analog converter, and the second converter comprises an analog-to-digital converter.

3. The amplifier according to claim 1, wherein the predistorter comprises a first filter and a second filter.

4. The amplifier according to claim 3, wherein the first filter receives the in-phase component of the input signal and the feedback signal to generate the first component of the predistortion signal.

5. The amplifier according to claim 3, wherein the second filter receives the quadrature component of the input signal and the feedback signal to generate the second component of the predistortion signal.

6. The amplifier according to claim 3, wherein the predistorter further comprises a first demodulator, a second demodulator, and a modulator.

7. The amplifier according to claim 6, wherein the first demodulator splits the input signal into the in-phase component and the quadrature component of the input signal, the second demodulator splits the feedback signal into the in-phase component and the quadrature component of the feedback signal, and the modulator combines the first component and the second component of the predistortion signal to generate the predistortion signal.

8. A method, comprising:
   generating, by a first converter, a preamplified signal based on a predistortion signal;
   generating, by a power amplifier, an output signal based on the preamplified signal and an input signal;
   sampling, by a second converter, the output signal to generate a feedback signal; and
   generating, by a predistorter, the predistortion signal based on the input signal;
   wherein the predistorter, based upon an in-phase component of the input signal and the feedback signal, introduces a first component of the predistortion signal corresponding to the in-phase component of the input signal, and the predistorter, based upon a quadrature component of the input signal and the feedback signal, introduces a second component of the predistortion signal corresponding to the quadrature component of the input signal;
  in order to compensate for nonlinearities in the in-phase component and the quadrature component, separately and independently applying by the predistorter:
    a first set of coefficients to the in-phase component, and
    a second set of coefficients to the quadrature-phase component, the first and second sets of coefficients being different from each other.

9. The method according to claim 8, wherein the first converter comprises a digital-to-analog converter, and the second converter comprises an analog-to-digital converter.

10. The method according to claim 8, wherein the predistorter comprises a first filter and a second filter.

11. The method according to claim 10, wherein the first filter receives the in-phase component of the input signal and the feedback signal to generate the first component of the predistortion signal.

12. The method according to claim 10, wherein the second filter receives the quadrature component of the input signal and of the feedback signal to generate the second component of the predistortion signal.

13. The method according to claim 10, wherein the predistorter further comprises a first demodulator, a second demodulator, and a modulator.

14. The method according to claim 13, wherein the first demodulator splits the input signal into the in-phase component and the quadrature component of the input signal, the second demodulator splits the feedback signal into the in-phase component and the quadrature component of the feedback signal, and the modulator combines the first component and the second component of the predistortion signal to generate the predistortion signal.

15. A non-transitory computer-readable medium, including computer code executable by a processor to perform:
  generating, by a first converter, a preamplified signal based on a predistortion signal;
  generating, by a power amplifier, an output signal based on the preamplified signal and an input signal;
  sampling, by a second converter, the output signal to generate a feedback signal; and
  generating, by a predistorter, the predistortion signal based on the input signal;
  wherein the predistorter, based upon an in-phase component of the input signal and the feedback signal, introduces a first component of the predistortion signal corresponding to the in-phase component of the input signal, and the predistorter, based upon a quadrature component of the input signal and the feedback signal, introduces a second component of the predistortion signal corresponding to the quadrature component of the input signal;
  in order to compensate for nonlinearities in the in-phase component and the quadrature component, separately and independently applying by the predistorter:
    a first set of coefficients to the in-phase component, and
    a second set of coefficients to the quadrature-phase component, the first and second sets of coefficients being different from each other.

16. The non-transitory computer-readable medium according to claim 15, wherein the first converter comprises a digital-to-analog converter, and the second converter comprises an analog-to-digital converter.

17. The non-transitory computer-readable medium according to claim 15, wherein the predistorter comprises a first filter and a second filter.

18. The non-transitory computer-readable medium according to claim 17, wherein the first filter receives the in-phase component of the input signal and the feedback signal to generate the first component of the predistortion signal.

19. The non-transitory computer-readable medium according to claim 17, wherein the second filter receives the quadrature component of the input signal and the feedback signal to generate the second component of the predistortion signal.

20. The non-transitory computer-readable medium according to claim 17, wherein the predistorter further comprises a first demodulator, a second demodulator, and a modulator.

* * * * *